April 9, 1968 D. W. B. SOMERVILLE ET AL 3,377,210

PROCESS OF FORMING SILICON CARBIDE DIODE BY GROWING SEPARATE P AND N LAYERS TOGETHER

Filed March 25, 1965

2 Sheets-Sheet 1

United States Patent Office 3,377,210
Patented Apr. 9, 1968

3,377,210

PROCESS OF FORMING SILICON CARBIDE DIODE BY GROWING SEPARATE P AND N LAYERS TOGETHER

Daniel William Bruce Somerville and Reino Olavi Tervo, Niagara Falls, Ontario, Canada, assignors to Norton Company, Worcester, Mass., a corporation of Massachusetts Continuation-in-part of application Ser. No. 365,329, May 6, 1964. This application Mar. 25, 1965, Ser. No. 442,666
4 Claims. (Cl. 148—1.5)

ABSTRACT OF THE DISCLOSURE

This invention relates to a method of forming a diode of silicon carbide by taking two separately formed layers of "P" and "N" conductively, providing flat surfaces on at least one face of each layer, placing the flat faces of each layer in contact and heating the contacted layers up at a sufficient temperature and time to cause the two layers to bond together.

This application is in part a continuation of our copending application Ser. No. 365,329 filed May 6, 1964.

This invention is directed to improved electronic devices made from silicon carbide and in particular to improved junction diodes and other semiconductor devices formed of silicon carbide.

The principal object of the present invention is to provide an improved silicon carbide product and method of producing the same.

Another object of the present invention is to provide such a product having unique physical, chemical and electrical properties.

Another object of the invention is to provide such a product which can be simply and cheaply manufactured under very carefully controlled conditions to provide ease of reproducibility for precise control of physical, chemical and electrical parameters.

Another object of the invention is to provide a silicon carbide junction diode having extreme abruptness at the P-N junction.

Another object of the invention is to provide a silicon carbide junction diode having a forward voltage characteristic considerably lower than that attainable with vapor grown silicon carbide junction diodes.

Another object of the invention is to provide a silicon carbide junction diode having physical properties comparable in many respects to those described by Rosenberg and Mlavsky in Electronic News, Sept. 2, 1963.

Another object of the invention is to provide a process for growing silicon carbide junction diodes having electrical and optical properties equivalent to those produced by the "TSM" (travelling solvent method) and having certain physical characteristics greatly superior to such diodes.

Another object of the invention is to provide an improved process for manufacturing silicon carbide junction diodes which provides a product having unique properties attainable by no other known technology.

These and other objects of the invention will in part be obvious and will in part appear hereinafter.

The invention accordingly comprises the product and process involving the several steps and the relation and the order of one or more of such steps with respect to each of the others which are exemplified in the following detailed disclosure and the scope of the application of which will be defined in the claims.

Figure 1:
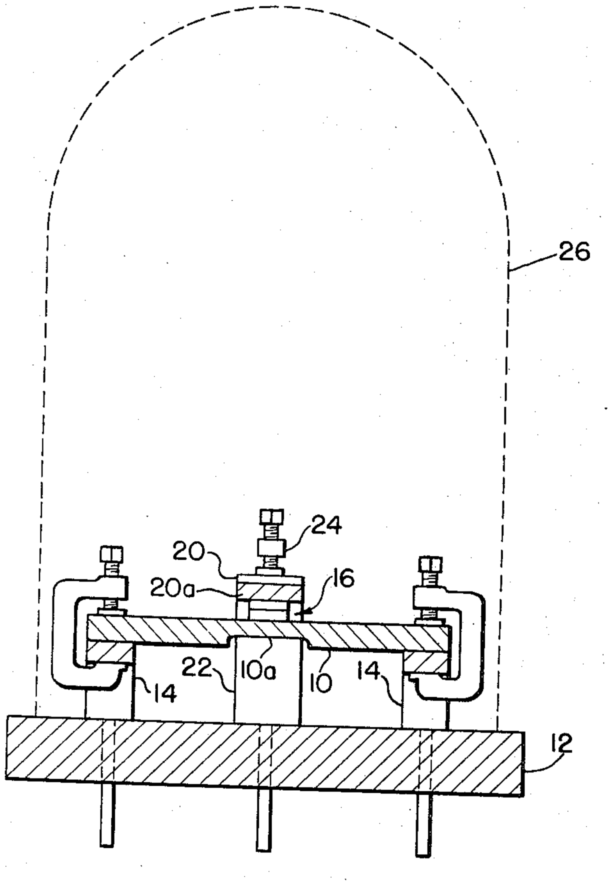
Figure 2:
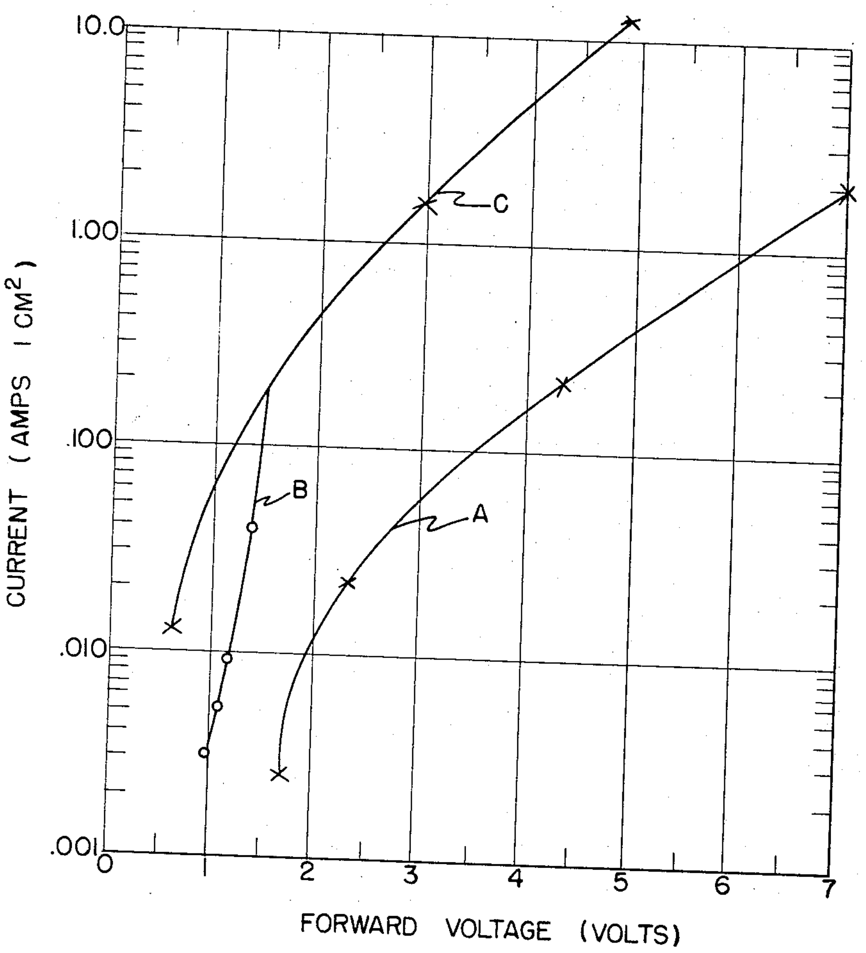

For a further understanding of the nature and objects of the invention, reference should be had to the following detailed description taken in connection with the accompanying drawings wherein:

FIG. 1 is a diagrammatic, fractional, sectional view of a preferred form of the apparatus useful for practicing the invention, and FIG. 2 is a graph comparing forward voltage characteristics of the diode of the present invention with the forward voltage characteristics of several other diodes.

In the production of silicon carbide devices and particularly the formation of light-emitting junction diodes, it has been discovered that certain silicon carbide junction diodes having abrupt junctions, as characterized by (a) low forward voltage characteristic, (b) high zero voltage capacitance and (c) high dislocation density at the junction, exhibit extremely interesting optical characteristics. When biased in the forward direction and subjected to high current density in the forward direction, such diodes have been reported by Rosenberg et al. (see above) to exhibit stimulated emission of radiation and produce extremely intense light of very narrow band width of about 4560 angstroms. When such a diode is formed with the proper optical cavity, it is reported that the light emitted indicates spatial coherence as well as an extremely narrow band width of emission.

While diodes produced by the travelling solvent method described by Rosenberg et al. have extremely interesting capabilities, their production is difficult to achieve on a uniform, reproducible basis with a yield of acceptable diodes having the capability of high efficiency stimulated emission in the blue portion of the visible spectrum.

In accordance with the present invention, the excellent physical and electrical properties of the present "TSM" grown silicon carbide junction diodes are duplicated and certain physical properties are obtained which are unobtainable, to date, on any reproducible basis with the TSM grown junction.

The present invention will be principally discussed in connection with the preferred embodiment wherein a junction diode is formed. In general, a single crystal of alpha-silicon carbide is selected which has a high concentration of impurities such as nitrogen so as to constitute an "N" crystal. This crystal preferably is formed by techniques described in Lowe U.S. Patent 3,025,192 and has parallel optically-flat faces normal to the C axis. In one preferred embodiment, this crystal is cut to a disk ¼-inch diameter by ultrasonic impact grinding. The planes at right angles to the C axis are polished flat. The crystal is then carefully cleaned and then mated with similar "P" type crystal containing an impurity such as aluminum. The P-type crystal is also preferably formed by the technique described in the Lowe patent and is also hexagonal alpha-silicon carbide having parallel optically-flat faces normal to the C axis. Two of these crystals are mounted in a resistance-heated furnace, the crystals being formed into a sandwich with the C axes aligned and are preferably rotationally aligned by use of the 60° edge crystal angles. Where the crystals are to be cut into disks, as described above, the alignment is done beforehand. Two heaters are pressed into contact with the upper and lower faces of the crystal sandwich. The heaters are independently powered for improved control of the temperature gradient across the crystal. The furnace is evacuated and is backfilled with argon; the heaters are then brought up rapidly to a temperature of above 2000° C. and maintained at this temperature for 10 seconds or more. Thereafter the furnace is cooled and the crystal is removed.

The resultant junction diode is provided with ohmic contacts of gold-silicon, gold-tantalum or other suitable alloys of the type described in U.S. Patents 3,047,429 and 3,063,876. The junction diode produced generally as described above has very unusual electrical characteristics. For example, it has an extremely low forward voltage characteristic on the order of .66 volt to produce a current of .0123 amp per square centimeter in the forward direction. The plane of the junction is optically flat and may even be crystallographically flat, although this is extremely difficult to measure exactly. As far as can be determined from the optical and X-ray determinations, the resulting junction diode has the appearance of a single crystal.

The junction diode formed by the present invention has the very remarkable advantage that the concentration gradient of impurities at the junction is extremely sharp. In fact, there is essentially no diffusion, even on an atomic scale, of impurities from the N crystal to the P crystal (or vice versa) in the plane of the junction. This provides an abruptness of junction which is unobtainable by any other known technology.

For purpose of more fully understanding the present invention, reference should be had to the following non-limiting examples:

Example I

Two optically-flat alpha silicon carbide crystals were selected. These crystals had opposite parallel faces normal to the C axis and each crystal had several well-defined 60° edge angles. The P crystal had the following characteristics:

| | | |
|---|---|---|
| Thickness | cm | .02 |
| Approximate area | sq. cm | .3 |
| Approximate aluminum concentration | p.p.m | 100 |
| Approximate P carrier concentration | | $2\times10^{17}$ |
| Holes/cc. at 25° C.: | | |
| Resistivity | ohms-cm | 0.8 |
| Hall coefficient | $cm.^3$/coulomb | 22 |

The N crystal had the following characteristics:

| | | |
|---|---|---|
| Thickness | cm | .02 |
| Approximate area | $cm.^2$ | .3 |
| Approximate nitrogen concentration | p.p.m | 800 |
| Approximate N carrier concentration | | $8\times10^{18}$ |
| Electrons/cc. at 25° C.: | | |
| Resistivity | ohms-cm | .02 |
| Hall coefficient | $cm.^3$/coulomb | 0.8 |

The crystals were carefully cleaned by washing in ethanol.

The P crystal was then placed on the lower heater element 10 shown in FIG. 1, and described in detail hereinafter. The N crystal was then placed on top of the P crystal with one corner 60° angle of the N crystal being aligned with a similar corner angle of the P crystal as closely as could be done by eye. The top heater element 20 was then carefully placed on top of the two crystals, the top heater running at right angles to the lower heater. The top heater was lightly clamped into position via a nut and screw arrangement (not shown) to hold it steady and to apply a light pressure to the sandwich of the two crystals. The bell jar 6 was then placed over the two heater elements and the bell jar was evacuated to a pressure on the order of $1\times10^{-5}$ torr. The bell jar was next backfilled with argon to a pressure of slightly above atmosphere. Current was then passed through the two graphite heaters bringing each of them rapidly up to a temperature of about 2150° C. for a time of about 10 to 15 seconds. The temperature was lowered to about 1800° C. in about 15 seconds. The heaters were independently maintained at a level temperature of about 1800° C. for 60 seconds and power was removed from the heaters which were cooled very rapidly within 15 seconds to a temperature below about 500° C.

The bell jar was opened and the crystal composite was removed. This crystal was examined and had the appearance of a single crystal. There was no detectable void at the junction which was clearly demarked by the difference in color of the two starting crystals. The fact that the two separate crystals grew together in this fashion is rather surprising since there certainly was no melting of the silicon carbide at the plane of junction of the two crystals. Ohmic contacts were put on the opposite faces of the crystal by use of Au-Ta alloy and Au-Ta-Al and the following electrical characteristics were measured with respect to this crystal composite:

Forward voltage characteristic—microamps per square centimeter:

| Voltage: | Amps/$cm.^2$ |
|---|---|
| 0.66 | .0123 |
| 1.30 | .123 |
| 2.90 | 1.23 |
| 4.85 | 12.3 |

Under forward bias, the above crystal had a broad light emission noticeable in a dark room with current densities above about 15 amps per square centimeter. As the current density increased the light noticeably shifted to the blue and became steadily brighter. While the experiment involving the band narrowing of the light was not set up to measure quantum efficiency or precise wavelength, the increased intensity of the light and the apparent narrowing of the band width were indications of stimulated emission. Blue light was also observed under reverse bias breakdown.

The diode was connected to a Q-meter to determine the space charge capacitance of its p-n junction. Measurements were made at about 250 kilocycles. The results of the measurements were plotted against voltage.

| V | C (microfarads/ sq. cm.) | $1/C^2$ |
|---|---|---|
| +1 | .231 | 18.85 |
| 0 | .204 | 24.1 |
| −1 | .183 | 30.0 |
| −2 | .171 | 34.2 |
| −3 | .161 | 38.8 |
| −4 | .157 | 40.8 |
| −5 | .154 | 42.5 |

The $1/C^2$ variation with voltage is linear from minus three to plus one volt. Such linearity is indicative of an abrupt junction (Jonscher, Principles of Semiconductor Device Operation, Bell and Sons Ltd., London, 1960, pp. 92–93). If one assumes the dielectric constant of the silicon carbide is 10, then one can calculate a junction depletion width at 0 bias, of 424 A. This is also indicative of an abrupt junction.

Example II

The purpose of this experiment was to provide further data on higher temperature treatment to two silicon carbide crystals to obtain good mechanical bonding at short heating cycles. In general, the experiment was conducted under conditions essentially the same as in Example I with some slight specific differences mentioned below.

The carbon face of a P-type crystal was polished flat with 0.25 micron diamond. The silicon face of an N-type crystal was polished flat with 0.25 micron diamond. The polished faces were juxtaposed and this pair was placed between the two separate graphite strips. Approximately 50 lb./$cm.^2$ pressure was applied perpendicularly to the polished faces. The current was turned on to the graphite strips so that both were raised in 10 seconds to 2370° C. This temperature was maintained for 10 seconds at which time the heater current was turned off. The temperature dropped rapidly so that it was below 1500° C. within 5 seconds. The silicon carbide sandwich was then removed and sliced into two small pieces. Visual examination under the microscope showed that the two crystals were well bonded. Attempts to break the crystals apart with probes were not successful indicating further that the crystals were strongly joined.

Referring now to FIG. 1, there is illustrated one preferred apparatus for practicing the present invention. This includes a graphite resistance heater element 10, supported on a base plate 12 by electrodes 14. As can be seen, the element 10 has a reduced section 10*a* which constitutes the bottom part of the furnace proper. A thermocouple (not shown) is mounted in reduced section 10*a* to get an accurate measurement of the temperature of the graphite resistance element 10. A sandwich 16 is shown, in greatly exaggerated size, between the section 10*a* and a corresponding section 20*a* of an upper heating element 20 which runs at right angles to bottom heating element 10. Heating element 20 is supported by electrode 22 and is clamped down by a suitable means. Suitable power sources are connected to the electrodes 14 and 22 but are not illustrated since they are of standard construction. Bell jar 26 is shown in dotted lines surrounding the furnace. The vacuum pumping connections, argon supply connections, etc., are not illustrated since they are also standard for laboratory equipment.

Referring now to FIG. 2, there is illustrated the forward voltage characteristic measured for three silicon carbide junction diodes. Curve A represents the forward voltage characteristic of a vapor grown silicon carbide junction diode prepared as described in Lowe Patent 3,025,192. Curve B represents the forward voltage characteristic of a silicon carbide junction diode prepared by the TSM method described by Rosenberg et al. in Electronic News, Sept. 2, 1963; Curve C represents the forward voltage characteristic of a silicon carbide junction diode prepared in accordance with the present invention.

In general, it can be stated that in order to achieve adequate mechanical bonding, at least one of the two heaters should be raised to a temperature of at least 2000° C. for at least a few seconds, and the other heater should be sufficiently hot so that the average temperature is at least 1600° C. during the hottest portion of the heating cycle. When the average temperature is on the order of 1600° C.–1700° C., the time of treatment should be several minutes. As the average temperature gets as high as 2200° C., the total time necessary to achieve excellent bonding is only 10 to 20 seconds. Above 2300° C., times as short as a couple of seconds have given satisfactory bonding.

While minimum times and temperatures for obtaining good mechanical bonding have been provided above, it should be apparent that temperatures considerably in excess of such minimum temperatures, and times much longer than the minimum times, may be employed. This is particularly true in those cases where interdiffusion of impurities from one crystal to the adjacent crystal is either unobjectionable or, in fact, desirable. However, when the utmost steepnes of concentration gradient across the junction is desired, operation should be at the minimum time and temperature necessary to obtain adequate bonding. In general, high temperatures and shortest feasible times appear to give sharper junctions than lower temperatures with the requisite longer times.

Many variations and alternative uses of invention can be made that differ from the above-described preferred embodiment. For instance, several crystals can be stacked to form multiple P-N junctions. Heretofore, the only form of theoretically dense silicon carbide was single crystal. The crystal pulling technology is quite limited as to obtainable sizes. According to the present invention, the single crystals can be sintered on one or more planes to other crystals to form larger structures of theoretical density. For instance, stacks of flat crystals can be sintered by the above-described process to produce useful mechanical high temperature structures. It is therefore intended that the description of the preferred embodiment, contained above and in the accompanying drawings, shall be regarded as illustrative and not in a limiting sense.

What is claimed is:

1. A method of forming a silicon carbide diode with an abrupt junction comprising the steps of forming first and second alpha-silicon carbide crystal slices, the first crystal being formed with donor impurities, the second crystal being formed with acceptor impurities, there being two parallel optically flat faces in each crystal slice normal to the "C" axis of the crystal, butting an optically-flat face of the first crystal against an optically-flat face of the second crystal in coaxial and rotation alignment therewith, heating the crystals above 1500° C. and below 2500° C. to grow them together as a diode with an abrupt rectifying barrier and essentially no diffusion of acceptor impurities into the original first crystal and essentially no diffusion of donor impurities into the second original crystal, said heating continuing for at least a few seconds and being accomplished in an inert atmosphere.

2. The method of forming a silicon carbide diode from separate "P" and "N" crystals of silicon carbide, each of said crystals having at least one flat polished face with a smoothness at least comparable to that obtained with .25 micron diamond dust, said flat faces being substantially normal to the C axes of the crystals, placing said crystals together with their flat faces in contact, heating said crystals in an inert atmosphere between two heating elements in contact with the outer faces of the crystals, one of said heating elements being raised to a temperature of at least 2000° C. and the other heating element being maintained at a sufficiently high temperature so that the average temperature between the two heating elements is at least 1600° C. during the hottest portion of the heating cycle and maintaining said temperature for at least a few seconds, the temperature of the contacting crystal faces being maintained below their melting point during the process.

3. The method of claim 2 wherein flat faces of adjacent crystals consist of silicon atoms on one face and carbon atoms on the other face.

4. The method of claim 2 wherein the growth step is accomplished by heating to 1500°–2500° C. for a period of at least 30 seconds and is controlled to avoid phase transition.

References Cited

UNITED STATES PATENTS

| | | | |
|---|---|---|---|
| 2,743,201 | 4/1956 | Johnson | 148—184 |
| 2,897,105 | 7/1959 | Hunter | 148—184 |
| 2,932,878 | 4/1960 | Jacobs. | |
| 2,937,324 | 5/1960 | Kroko | 148—171 |
| 3,124,454 | 3/1964 | Berman | 148—177 |
| 3,205,101 | 9/1965 | Mlavsky | 148—171 |
| 3,303,549 | 2/1967 | Peyser | 29—155.5 |

HYLAND BIZOT, *Primary Examiner.*